US005381041A

United States Patent [19]
Harmon

[11] Patent Number: 5,381,041
[45] Date of Patent: Jan. 10, 1995

[54] SELF CLAMPING HEAT SINK

[75] Inventor: Ronald A. Harmon, Hudson, Mass.

[73] Assignee: Wakefield Engineering, Inc., Wakefield, Mass.

[21] Appl. No.: 222,843

[22] Filed: Apr. 5, 1994

[51] Int. Cl.[6] .................. H01L 23/02; H01L 23/40
[52] U.S. Cl. .................. 257/718; 257/727; 257/675; 257/706; 165/80.2
[58] Field of Search .......... 257/718, 727, 675, 706; 165/80.2, 80.3

[56] References Cited

U.S. PATENT DOCUMENTS

| | | | |
|---|---|---|---|
| 3,893,161 | 7/1975 | Pesak, Jr. | 257/718 |
| 4,054,901 | 10/1977 | Edwards et al. | 165/80.3 |
| 4,215,361 | 7/1980 | McCarthy | 257/718 |
| 4,261,005 | 4/1981 | McCarthy | 257/718 |
| 5,130,888 | 7/1992 | Moore | 257/727 |

FOREIGN PATENT DOCUMENTS 91005369  4/1991  European Pat. Off. ........... 257/718

Primary Examiner—Jerome Jackson
Assistant Examiner—Nathan K. Kelley
Attorney, Agent, or Firm—Blodgett & Blodgett

[57] ABSTRACT

A self clamping heat sink for releasable connection to an electrical component having a bottom surface and a top surface. The self clamping heat sink includes a base and a pair of inverted U-shaped spring arms at opposite sides of the base which extend upwardly from the base. A clamping finger extends inwardly from the outer leg portion of each spring arm to a free end which overlies the base. The free ends of the spring arms are raised to an upper position relative the base by applying external force to squeeze the outer leg portions of the spring arm toward each other. This enables an electrical component to be placed on the base and below the free ends of the clamping fingers. When external force is removed from the spring arms, the clamping fingers try to return to their normal lower position and engage the top surface of the electrical component so that the electrical component is clamped between the base and the fingers.

11 Claims, 2 Drawing Sheets

5,381,041

SELF CLAMPING HEAT SINK

BACKGROUND OF THE INVENTION

The present invention is directed to an improved heat sink for clamping to an electrical component and, specifically, to an electronic semiconductor component package, such as a TO-220 semiconductor package which has a housing that contains electrical connections and which has projecting metallic tabs. The heat sink is a resilient sheet metal element which can be clamped to the electrical component and which has a relatively large contact surface with the electrical component for conduction of heat from the electrical component to the heat sink and a relatively large radiating surface for dissipation of heat from the heat sink.

Self clamping heat sinks of the prior art are awkward to apply to electrical components, usually requiring special tools to apply. Since the heat sinks are difficult to apply, the tabs which project from the electrical components are frequently disturbed which causes damage to the electrical connections within the components. The difficulty of applying the heat sinks to the components results in fatigue to the assembly workers and sometimes loss of feeling in the ends of the fingers of the assembly workers. As fatigue sets in, it is difficult for the worker to exercise the precision required for application of the heat sinks to the electrical components. This results in increased damage to the components which progressively worsens toward the end of the work shift. These and other difficulties experienced with the prior art self clamping heat sinks have been obviated by the present invention.

It is, therefore, a principle object of the invention to provide a self clamping heat sink for electrical components which can be applied easily to the component by hand to avoid worker fatigue and damage to the component.

Another object of the invention is the provision of a self clamping heat sink which is easy to apply and which creates a minimum of clamping pressure to the component which avoids damaging the component while remaining securely attached to the component.

A further object of the present invention is the provision of a self clamping heat sink for application to an electrical component which provides improved heat conduction between the heat sink and electrical component and improved heat radiation from the heat sink.

It is another object of the invention to provide a self clamping heat sink for application to an electrical component which is simple in construction, inexpensive to manufacture and easy to use.

With these and other objects in view, as will be apparent to those skilled in the art, the invention resides in the combination of pans set for in the specification and covered by the claims appended hereto.

SUMMARY OF THE INVENTION

A self clamping heat sink for releasable connection to an electrical component having a bottom surface and a top surface. The heat sink includes a base and a pair of inverted U-shaped spring arms which are fixed to opposite sides of the base. Each spring arm includes an inner leg portion which is fixed to the base and which extends upwardly from the base and an outer leg portion which is fixed to the inner leg portion and which extends downwardly to a free end. The outer and inner legs of each spring arm are spaced from one another. Each spring arm has a cantilevered clamping finger which is fixed to the outer leg portion and which extends toward the base. Each clamping finger has a free end which is vertically aligned with the upper surface of the base and which clamps down with spring pressure on the upper surface of an electrical component which is positioned on the upper surface of the base. The outer leg portion of each spring arm is resiliently bendable toward the inner leg portion so that when a predetermined amount of external force is applied to the outer leg portions, they bend toward one another and cause free ends of the clamping fingers to lift above the upper surface of the electrical component, thereby allowing the heat sink to be removed from, or applied to, the component. When pressure is released from the outer leg portions, the leg portions return to their normal outer positions, thereby allowing the free ends of the clamping fingers to bear down upon the upper surface of the electrical component for clamping the heat sink to the component. More specifically, the inner leg portion of each spring arm is provided with an aperture through which the clamping finger extends, the clamping finger being preferably formed from a portion of the outer leg portion.

BRIEF DESCRIPTION OF THE DRAWINGS

The character of the invention, however, may be best understood by reference to several structural forms, as illustrated by the accompanying drawings, in which.

DESCRIPTION OF THE PREFERRED EMBODIMENT

Figure 1:
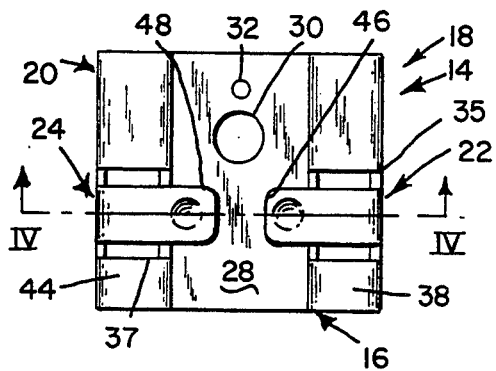
FIG. 1 is a top plan view of a self clamping heat sink, embodying the principles of the present invention.
Figure 2:
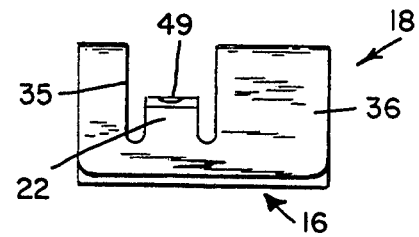
FIG. 2 is a right side elevational view of the heat sink.

Referring to FIGS. 1-6, there is shown a preferred embodiment of the clamping heat sink of the present invention which is generally indicated by the reference numeral 14. The clamping heat sink 14 has a flat base, generally indicated by the reference numeral 16, a first inverted U-shaped spring arm, generally indicated by the reference numeral 18 which is fixed to one side of the base 16, a second inverted U-shaped spring arm, generally indicated by the reference numeral 20 which is fixed to the opposite side of the base 16, a first cantilevered clamping finger 22 which is fixed to the first spring arm 18 and a second cantilevered clamping finger, generally indicated by the reference numeral 24 which is fixed to the second spring arm 20.

Figure 4:
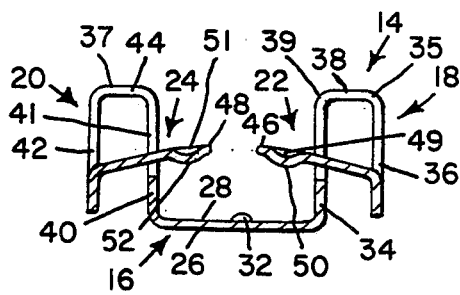
FIG. 4 is a vertical cross-sectional view of the heat sink, taken along the line IV—IV of FIG. 1.

The base 16 has a flat bottom surface 26 and a flat top surface 28. The base 16 has an aperture 30 and a protuberance 32 on the upper surface 28. The protuberance 32 functions as a locating element for an electrical component which is to be positioned on the base 16. The first spring arm 18 includes an inner leg portion 34 which is fixed to one side of the base 16 and which extends upwardly from the base and an outer leg portion 36 which is connected to the leg portion 34 by an upper transition portion 38. The outer leg portion 36 extends downwardly from the transition portion 38 outside of and spaced from the inner leg portion 34 in cantilever fashion. The second spring arm 20 includes an inner leg portion 40 which is fixed to the opposite side of the base 16 and which extends upwardly from the base and an outer leg portion 42 which is connected to the inner leg portion through an upper transition portion 44 so that the outer leg portion 42 extends downwardly outside of and spaced from the inner leg portion 40 in cantilever fashion. The inner leg portion 34 of the first spring arm 18 has an aperture 39. The inner leg portion 40 of the second spring arm 20 has an aperture 41. The first clamping finger 22 is fixed to the outer leg portion 36 and extends through the aperture 39 as shown in FIGS. 1 and 4. The clamping finger 22 has a free end 46 which lies above the upper surface 28 of the base. The outer end of the clamping finger 22 has a downwardly-extending dent 49 which forms a downwardly facing convex surface 50. The clamping finger 24 is fixed to the outer leg portion 42 and extends inwardly toward the base 16 through the aperture 41. The finger 24 has a free end 48 which contains a downwardly-extending dimple 51 which forms a downwardly-facing convex surface 52 which is vertically aligned with the upper surface 28 of the base.

The clamping heat sink 14 is preferably formed from a resilient one-piece sheet metal strip by means of appropriate cuts and bends in the piece of sheet metal. A double cut is made in the upper portions of the cantilevered second spring arms 18 and 20, respectively, to form cut-out areas 35 and 37, respectively. The clamping finger 22 is formed from material from within the cut-out area 35. The first clamping finger 22 is bent downwardly through the aperture 39 toward the base 16 to a position shown in FIGS. 3 and 4. The dent 49 is formed in the end of the finger 22 to create the convex surface 50. The second clamping finger 24 is formed from material within the cut-out area 37. The second clamping finger 24 is bent downwardly through the aperture 41 toward the base 16 to the position shown in FIGS. 3 and 4. The dent 51 is formed in the outer end of the finger to create the downwardly facing convex surface 52. The heat sink 18 is cut and bent into the configuration shown in the drawings by exceeding the elastic limit of the material. However, the material retains its resiliency so that parts can be bent to a predetermined degree and still return to their starting position. For example, the outer leg portions 36 and 42 can be bent toward each other from the full line positions.

Figure 3:
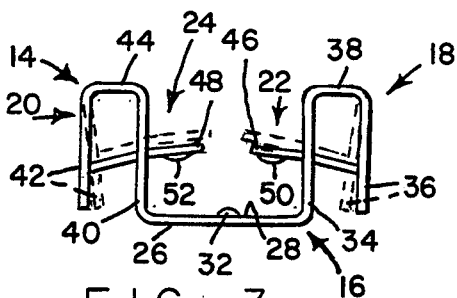
FIG. 3 is a front elevational view of the heat sink.
Figure 5:
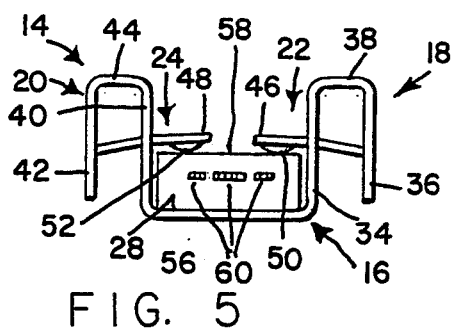
FIG. 5 is a front elevational view of the heat sink showing the heat sink applied to an electrical component.
Figure 6:
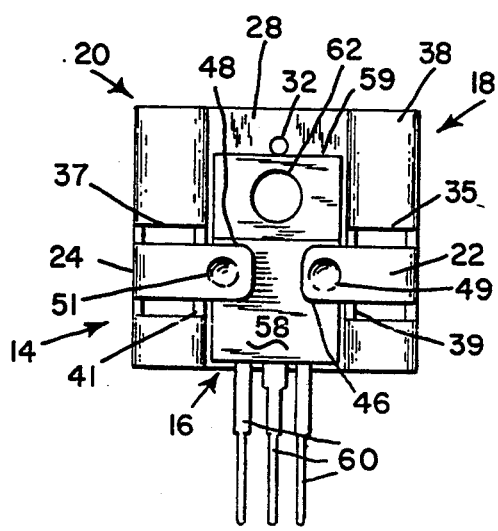
FIG. 6 is a top plan view of the heat sink, showing the heat sink applied to the electrical component.
Figure 7:
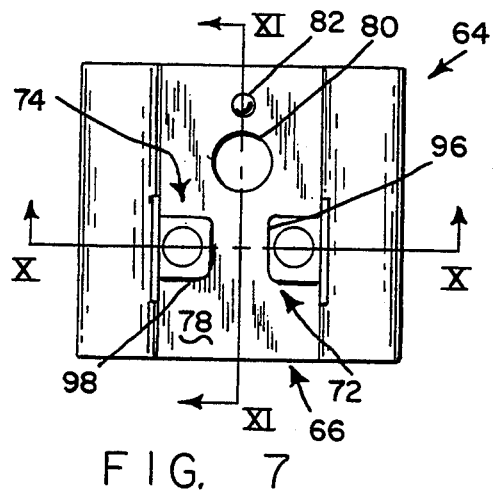
FIG. 7 is a top plan view of a modified heat sink embodying the principles of the present invention.
Figure 8:
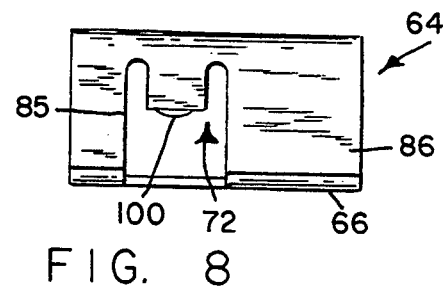
FIG. 8 is a fight side elevational view of the heat sink of FIG. 7.

The clamping heat sink 18 is applied to an electrical component such as the component 54 shown in FIGS. 5 and 6 by grasping the heat sink at the outer leg portions 36 and 42 between two fingers and squeezing the heat sink so that the outer leg portions 36 and 42 bend toward each other to the dotted line positions shown in FIG. 3. This inward bending of the leg portions 36 and 42 causes the clamping fingers 22 and 24 to move upwardly relative to the base 16 from the full line positions to the dotted line positions shown in FIG. 3. This provides sufficient clearance between the clamping fingers 22 and 24 and the upper surface 28 of the base to enable the electrical component to be inserted between the inner leg portions 34 and 40 so that the bottom surface of the electrical component, indicated by the reference numeral 56, rests on the top surface 28 of the base. The electrical component has an aperture 62 at the rear end thereof and projecting metal tabs 60 at the forward end thereof. When the electrical component 54 is placed on the base as shown in FIG. 6, the rear edge 59 strikes the protuberance 32. This insures that the electrical component 54 is properly positioned on the base 16 so that the aperture 62 of the component is vertically aligned with the aperture 30 of the base. This enables the electrical component and the heat sink to be fixed by fastening means to a circuit board or the like. When squeezing pressure is released from the leg portions 36 and 42, they return to their full line position as shown in FIG. 3, thereby allowing the free ends of the fingers to return to their normal full line positions as shown in FIG. 3. The convex surfaces 50 and 52 of the clamping arms 22 and 24, respectively, engage the top surface 58 of the electrical component 54 with spring pressure from the leg portions 36 and 42 due to the fact that the upward surface 58 of the electrical component is slightly higher than the normal lower or full line position of the clamping fingers 22 and 24 shown in FIG. 3. The downward pressure which is applied to the electrical component 54 is not so great as to cause damage to the component and yet maintains the electrical component firmly and securely in place within the channel which is formed by the inner leg portions 34 and 40. The bottom surface of the electrical component 54 is in contact with the base of the heat sink for effective conduction of heat from the electrical component to the heat sink. The freely extending areas of the heat sink provide effective radiation of heat away from the heat sink. This effectiveness is increased by the spacing between the inner and outer leg portions of the spring arms by providing maximum surface area and channels for cooling air flow.

DESCRIPTION OF MODIFIED HEAT SINK

Referring to FIGS. 7–11, there is shown a modified embodiment of the clamping heat sink of the present invention which is generally indicated by the reference numeral 64. The clamping heat sink 64 has a flat base, generally indicated by the reference numeral 66, a first inverted U-shaped spring arm, generally indicated by the reference numeral 68 which is fixed to one side of the base 66, a second inverted U-shaped spring arm, generally indicated by the reference numeral 70 which is fixed to the opposite side of the base 66, a first cantilevered clamping finger 72 which is fixed to the first spring arm 68 and a second cantilevered clamping finger, generally indicated by the reference numeral 74 which is fixed to the second spring arm 70.

Figure 10:
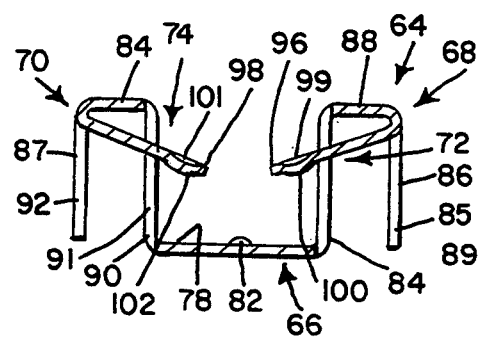
FIG. 10 is a vertical cross-sectional view of the heat sink of FIG. 7, taken along the line X—X of FIG. 7.
Figure 11:
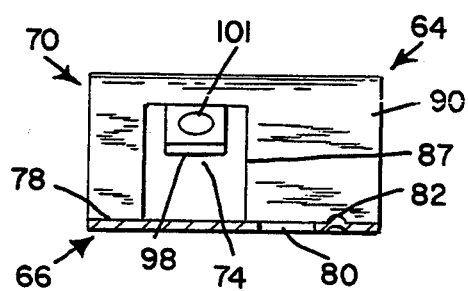
FIG. 11 is a vertical cross-sectional view of the heat sink of FIG. 7, taken along the line XI—XI of FIG. 7.

The base 66 has a flat bottom surface 76 and a flat top surface 78. The base 66 has an aperture 80 and a protuberance 82 on the upper surface 78. The protuberance 82 functions as a locating element for an electrical component which is to be positioned on the base 66. The first spring arm 68 includes an inner leg portion 84 which is fixed to one side of the base 66 and which extends upwardly from the base and an outer leg portion 86 which is connected to the leg portion 84 by an upper transition portion 88. The outer leg portion 86 extends downwardly from the transition portion 88 outside of and spaced from the inner leg portion 84 in cantilever fashion. The second spring arm 70 includes an inner leg portion 90 which is fixed to the opposite side of the base 66 and which extends upwardly from the base and an outer leg portion 92 which is connected to the inner leg portion through an upper transition portion 94 so that the outer leg portion 92 extends downwardly outside of and spaced from the inner leg portion 90 in cantilever fashion. The inner leg portion 84 of the first spring arm 68 has an aperture 89. The inner leg portion 90 of the second spring arm 70 has an aperture 91. The first clamping finger 72 is fixed to the outer leg portion 86 and extends through the aperture 89 as shown in FIGS. 6 and 10. The clamping finger 72 has a free end 96 which lies above the upper surface 78 of the base. The outer end of the clamping finger 72 has a downwardly-extending dent 99 which forms a downwardly facing convex surface 100. The clamping finger 74 is fixed to the outer leg portion 92 and extends inwardly toward the base 66 through the aperture 91. The finger 74 has a free end 98 which contains a downwardly-extending dimple 101 which forms a downwardly-facing convex surface 102 which is vertically aligned with the upper surface 78 of the base.

The clamping heat sink 64 is preferably formed from a resilient one-piece sheet metal strip by means of appropriate cuts and bends in the piece of sheet metal. Apertures 89 and 91 are formed in the inner leg portions 84 and 90, respectively, A double cut is made in each of the outer leg portions 86 and 87 of the cantilevered second spring arms 68 and 70, respectively, to form cut-out areas 85 and 87, respectively. The clamping finger 72 is formed from material from within the cut-out area 85. The first clamping finger 72 is bent upwardly through the aperture 89 to the position shown in FIGS. 9 and 10. The dent 99 is formed in the end of the finger 72 to create the convex surface 100. The second clamping finger 74 is formed from material within the cut-out area 87 from the area of the outer leg portion 92 in the upper transition portion 94. The second clamping finger 74 is bent upwardly through the aperture 91 to the position shown in FIGS. 9 and 10. The dent 101 is formed in the outer end of the finger to create the downwardly facing convex surface 102. The heat sink 68 is cut and bent into the configuration shown in the drawings by exceeding the elastic limit of the material. However, the material retains its resiliency so that parts can be bent to a predetermined degree and still return to their starting position. For example, the outer leg portions 86 and 92 can be bent toward each other from the full line positions to the dotted line positions as shown in FIG. 9 and will return to the full line positions.

Figure 9:
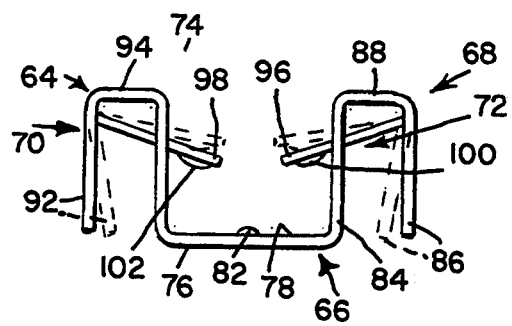
FIG. 9 is a front elevational view of the heat sink of FIG. 7.

The clamping heat sink 68 is applied to an electrical component by grasping the heat sink at the outer leg portions 86 and 92 between two fingers and squeezing the heat sink so that the outer leg portions 86 and 92 bend toward each other to the dotted line positions as shown in FIG. 9. This inward bending of the leg portions 86 and 92 causes the clamping fingers 72 and 74 to move upwardly relative to the base 66 from the full line positions to the dotted line positions as shown in FIG. 9. This provides sufficient clearance between the clamping fingers 72 and 74 and the upper surface 78 of the base to enable the electrical component to be inserted between the inner leg portions 84 and 90 so that the bottom surface of the electrical component rests on the top surface 78 of the base. When an electrical component such as component 54 is placed on the base 66, the rear edge 59 strikes the protuberance 82. This insures that the electrical components 54 is properly positioned on the base 66 so that the aperture 62 of the component is vertically aligned with the aperture 80 of the base. When squeezing pressure is released from the leg portions 86 and 92, they return to their full line position and shown in FIG. 9, thereby allowing the free ends of the fingers to return to their normal full line positions shown in FIG. 9. The convex surfaces 100 and 102 of the clamping arms 72 and 74, respectively, engage the top surface 58 of the electrical component 54 with spring pressure from the leg portions 36 and 42 due to the fact that the upward surface 58 of the electrical component is slightly higher than the normal lower or full line position of the clamping fingers 72 and 74 shown in FIG. 9. The downward pressure which is applied to the electrical component 54 is not so great as to cause damage to the component and yet maintains the component firmly and securely in place within the channel which is formed by the leg portions 84 and 90. The bottom surface of the electrical component 54 is in contact with the base of the heat sink for effective conduction of heat from the electrical component to the heat sink and the freely-extending areas of the heat sink provide effective radiation of heat away from the heat sink. This effectiveness is increased by the spacing between the inner and outer leg portions of the spring arms by providing maximum surface area and channels for cooling air flow.

I claim:

1. A self clamping heat sink for releasable connection to an electrical component having a bottom surface and a top surface, said self clamping heat sink comprising:
   (a) a base having an upper horizontal surface;
   (b) a cantilevered spring arm which is fixed to said base and which is located above and out of vertical alignment with the upper surface of said base, said spring arm normally occupying a clamping position relative to said base and being resiliently bendable to a non-clamping position toward the base upon the application of a predetermined external force to said spring arm; and
   (c) a cantilevered clamping finger which is fixed to said spring arm and which extends toward said base said clamping finger having a free end which is vertically aligned with and spaced from the upper surface of said base so that when said spring arm is moved from said clamping position to said non-clamping position, the free end of said clamping finger is moved away from the upper surface of said base for enabling the free end of said clamping finger to be spaced from the upper surface of an electrical component which is placed on the upper surface of said base to enable said electrical component to be removed from and applied to the upper surface of said base, the free end of said clamping finger engaging the upper surface of said electrical component with spring pressure in the absence of said predetermined force due to the spring bias of said spring arm toward its clamping position.

2. A self clamping heat sink as recited in claim 1, wherein said spring arm is a first spring arm and said clamping finger is a first clamping finger, said self clamping heat sink further comprising a second spring arm which is identical to said first spring arm and a second clamping finger which is identical to said first clamping finger, said first spring arm being fixed to a first side of said base, said second spring arm being fixed to a second side of said base which is opposite said first side, said first clamping finger extending from said first spring arm toward said second side, said second clamping finger extending from said second spring arm toward said first side.

3. A self clamping heat sink as recited in claim 2, wherein said first and second clamping fingers are horizontally aligned and the free ends of said first and second clamping fingers are spaced from one another.

4. A self clamping heat sink as recited in claim 1, wherein said spring arm comprises:
   (a) an inner leg portion which is fixed to said base and which extends upwardly from said base; and
   (b) an outer leg portion which is fixed to said inner leg portion at a connecting point above said base and which extends downwardly from said connecting point, said clamping finger being fixed to said outer leg portion and extending toward said inner leg portion.

5. A self clamping heat sink as recited in claim 1, wherein the free end of said clamping finger has a convex lower surface for engaging the top surface of said electrical component.

6. A self clamping heat sink for releasable connection to an electrical component having a bottom surface and a top surface, said self clamping heat sink comprising:
   (a) a base having an upper horizontal surface, a first side and a second side which is opposite said first side;
   (b) an inverted U-shaped spring arm which has an inner leg portion which is fixed to said first side and which extends upwardly from said first side and an outer leg portion which is spaced from said inner leg portion and which extends downwardly from said inner leg portion to a free end, said outer leg portion being out of vertical alignment with the upper surface of said base and normally occupying a clamping position and being resiliently bendable toward said inner leg portion and said base to a non-clamping position upon application of a predetermined external force to said outer leg portion in the direction of said inner leg portion;
   (c) a cantilevered clamping finger which is fixed to said outer leg portion and which extends toward said base, said clamping finger having a free end which is vertically aligned with the upper surface of said base and which is positioned above the upper surface of said base so that when said outer leg portion is in said non-clamping position, the free end of said clamping finger is spaced from the top surface of an electrical component which is placed on the upper surface of said base to enable said electrical component to be removed from and applied to the upper surface of said base, the free end of said clamping finger engaging the top surface of said electrical component with spring pressure in the absence of said predetermined external force to said outer leg portion due to the spring bias of said outer leg toward its clamping position.

7. A self clamping heat sink for releasable connection to an electrical component having a bottom surface and a top surface, said self clamping heat sink comprising:
   (a) a base having an upper horizontal surface, a first side and a second side which is opposite said first side;
   (b) a first inverted U-shaped spring arm which has a vertical inner leg portion which is fixed to the first side of said base, and a vertical outer leg portion which is spaced from said inner leg portion and which terminates in a free end, said outer end portion being resiliently bendable toward said inner leg portion;
   (c) a first cantilevered clamping finger which is fixed to the outer leg of said first spring arm and which extends toward said base, said first clamping finger having a free end which bears down with biasing pressure from said outer leg portion on the top surface of an electrical component which rests on the upper surface of said base;
   (d) a second inverted U-shaped spring arm which has a vertical inner leg portion which is fixed to the second side of said base, and a vertical outer leg portion which is spaced from the inner leg portion of said second spring arm and which terminates in a free end, the outer end portion of said second spring arm being resiliently bendable toward the inner leg portion of said second spring arm; and
   (e) a second cantilevered clamping finger which is fixed to the outer leg of said second spring arm and which extends toward said base, said second clamping finger having a free end which bears down with biasing pressure from the outer leg portion of said second spring arm on the upper surface of said electrical component, the free ends of said first and second clamping finger moving to a position above the top surface of said electrical component upon application of an external force to said outer leg portions to bend said outer leg portions of said first and second spring arm toward each other to enable said electrical component to be removed from and applied to the upper surface of said base, said first and second clamping fingers engaging the top surface of said electrical component upon removal of said external force to said outer leg portions.

8. A self clamping heat sink for releasable connection to an electrical component having a bottom surface and a top surface, said self clamping heat sink comprising:
   (a) a base having an upper horizontal surface, a first side and a second side which is opposite said first side;
   (b) a first inverted U-shaped spring arm which has a first inner leg portion which is fixed to said first side and which extends upwardly from said first side and a first outer leg portion which is spaced from said first inner leg portion and which extends downwardly from said first inner leg portion to a free end, said first outer leg portion normally occupying a clamping position and being resiliently bendable toward said first inner leg portion to a non-clamping position upon application of a predetermined external force to said first outer leg portion in the direction of said first inner leg portion;
   (c) a cantilevered first clamping finger which is fixed to said first outer leg portion and which extends toward said base, said first clamping finger having a free end which is vertically aligned with the upper surface of said base and which is positioned above the upper surface of said base so that when said first outer leg portion is in said non-clamping position, the free end of said first clamping finger is spaced from the top surface of an electrical component which is placed on the upper surface of said base to enable said electrical component to be removed from and applied to the upper surface of said base, the free end of said first clamping finger engaging the top surface of said electrical component with spring pressure in the absence of said predetermined external force to said outer leg portion due to the spring bias of said first outer leg toward its clamping position;

(d) a second inverted U-shaped spring arm which has a second inner leg portion which is fixed to said second side and which extends upwardly from said second side and a second outer leg portion which is spaced from said second inner leg portion and which extends downwardly from said second inner leg portion to a free end, said second outer leg portion normally occupying a clamping position and being resiliently bendable toward said second inner leg portion to a non-clamping position upon application of a predetermined external force to said second outer leg portion in the direction of said second inner leg portion;

(e) a cantilevered second clamping finger which is fixed to said second outer leg portion and which extends toward said base, said second clamping finger having a free end which is vertically aligned with the upper surface of said base and which is positioned above the upper surface of said base so that when said second outer leg portion is in said non-clamping position, the free end of said second clamping finger is spaced from the top surface of an electrical component which is placed on the upper surface of said base to enable said electrical component to be removed from and applied to the upper surface of said base, the free end of said second clamping finger engaging the top surface of said electrical component with spring pressure in the absence of said predetermined external force to said second outer leg portion due to the spring bias of said second outer leg toward its clamping position, said first and second outer leg portions being horizontally opposed so that said first and second outer leg portions can be moved simultaneously to their respective non-clamping positions by grasping said clamping heat sink by said first and second outer leg portions and squeezing said first and second outer leg portions toward one another.

9. A self-clamping heat sink as recited in claim 8, wherein said first and second clamping fingers are horizontally aligned and the free ends of said first and second clamping fingers are spaced from one another.

10. A self-clamping heat sink for releasable connection to an electrical component having a bottom surface and a top surface, said self clamping heat sink comprising;

(a) a base having an upper horizontal surface, a first side and a second side which is opposite said first side;

(b) an inverted U-shaped spring arm which has an inner leg portion which is fixed to said first side and which extends upwardly from said first side and an outer leg portion which is spaced from said inner leg portion and which extends downwardly from said inner leg portion to a free end, said outer leg potion normally occupying a clamping position and being resiliently bendable toward said inner leg portion to a non-clamping position upon application of a predetermined external force to said outer leg potion in the direction of said inner leg portion, said inner leg portion having an aperture;

(c) a cantilevered clamping finger which is fixed to said outer leg portion and which extends through the aperture in said inner leg portion toward said base, said clamping finger having a free end which is vertically aligned with the upper surface of said base and which is positioned above the upper surface of said base so that when said outer leg portion is in said non-clamping position, the free end of said clamping finger is spaced from the top surface of an electrical component which is placed on the upper surface of said base to enable said electrical component to be removed from and applied to the upper surface of said base, the free end of said clamping finger engaging the top surface of said electrical component with spring pressure in the absence of said predetermined external force to said outer leg portion due to the spring bias of said outer leg toward its clamping position.

11. A self-clamping heat sink as recited in claim 10, wherein said clamping finger is an integral part of said outer leg portion, said clamping finger being formed from material from said outer leg portion and bent through said aperture toward said base.

* * * * *